(12) United States Patent
Zolfaghari et al.

(10) Patent No.: US 8,280,322 B2
(45) Date of Patent: Oct. 2, 2012

(54) RF TRANSMITTER WITH STABLE ON-CHIP PLL

(75) Inventors: Alireza Zolfaghari, Irvine, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 137 days.

(21) Appl. No.: 12/702,198

(22) Filed: Feb. 8, 2010

(65) Prior Publication Data

US 2010/0135434 A1 Jun. 3, 2010

Related U.S. Application Data

(62) Division of application No. 11/824,663, filed on Jul. 2, 2007, now Pat. No. 7,848,725.

(51) Int. Cl.
*H03C 3/00* (2006.01)
*H04B 1/68* (2006.01)
(52) U.S. Cl. ............... 455/109; 455/234.1; 455/323; 455/334; 375/345
(58) Field of Classification Search ........... 455/109, 455/230, 232.1, 234.1, 255–260, 323, 333, 455/334; 375/345
See application file for complete search history.

(56) References Cited

U.S. PATENT DOCUMENTS

| 6,784,752 B2* | 8/2004 | Gauthier et al. ........ 331/16 |
| 2002/0109553 A1* | 8/2002 | Tran et al. ........ 331/36 C |
| 2006/0141963 A1* | 6/2006 | Maxim et al. ........ 455/192.1 |
| 2006/0211381 A1* | 9/2006 | Jensen ........ 455/76 |
| 2006/0280258 A1* | 12/2006 | Bettesh ........ 375/274 |

* cited by examiner

*Primary Examiner* — Nhan Le
(74) *Attorney, Agent, or Firm* — Garlick & Markison; Bruce E. Garlick (57) ABSTRACT

A phase locked loop (PLL) a phase detector, a charge pump, a loop filter, a controlled oscillator, and a feedback divider. The phase detector is coupled to produce a difference signal based on a difference between phase of a reference oscillation and phase of a feedback oscillation. The charge pump is coupled to convert the difference signal into an up-signal or a down signal. The loop filter coupled to filter the up signal or the down signal to produce a control signal. The controlled oscillator is coupled to generate an output oscillation based on the control signal. The feedback divider is coupled to generate the feedback oscillation from the output oscillation based on a divider value. The loop filter includes a first resistor-capacitor circuit and a second resistor-capacitor circuit. The first resistor-capacitor circuit is calibrated using a first calibration technique and the second resistor-capacitor circuit is calibrated using a second calibration technique.

22 Claims, 10 Drawing Sheets

RF TRANSMITTER WITH STABLE ON-CHIP PLL

CROSS REFERENCE TO RELATED PATENTS

The present U.S. Utility Patent Application claims priority pursuant to 35 U.S.C. §120, as a divisional, to U.S. Utility patent application Ser. No. 11/824,663, entitled "RF Transmitter with Stable On-Chip PLL," filed Jul. 2, 2007, pending, which is hereby incorporated herein by reference in its entirety and made part of the present U.S. Utility Patent Application for all purposes.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to wireless communication systems and more particularly to an radio frequency transmitter.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases (i.e., polar coordinates). The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component) or polar coordinates. The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

In each of the above described transmitters, a phase locked loop (PLL) is used to facilitate the generation of an RF signal. Typically, the PLL is fabricated on-chip with at least a part of the transmitter. An issue with on-chip PLLs is maintaining the PLL's bandwidth at a desired level. Since the bandwidth of the PLL substantially influences the overall bandwidth of the transmitter, many techniques have been developed to control the PLL's bandwidth. For example, one solution is to use an off-chip loop filter circuit such that high precision components may be used. This has the obvious drawback of using an off-chip loop filter. Another solution is to use metal capacitors within an on-chip loop filter, but metal capacitors are very large in comparison to transistors. Yet another solution is to calibrate the resistors and capacitors within the loop filter. This solution requires an RC (resistor calibration circuit) that calibrates both the resistors and capacitors. In some PLLs, the required operating frequency and bandwidth requires such small resistors, it is impractical to calibrate them.

Therefore, a need exists for a phase locked loop that includes a loop filter that overcomes at least some of the above mentioned limitations for use in RF transmitters and other applications.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
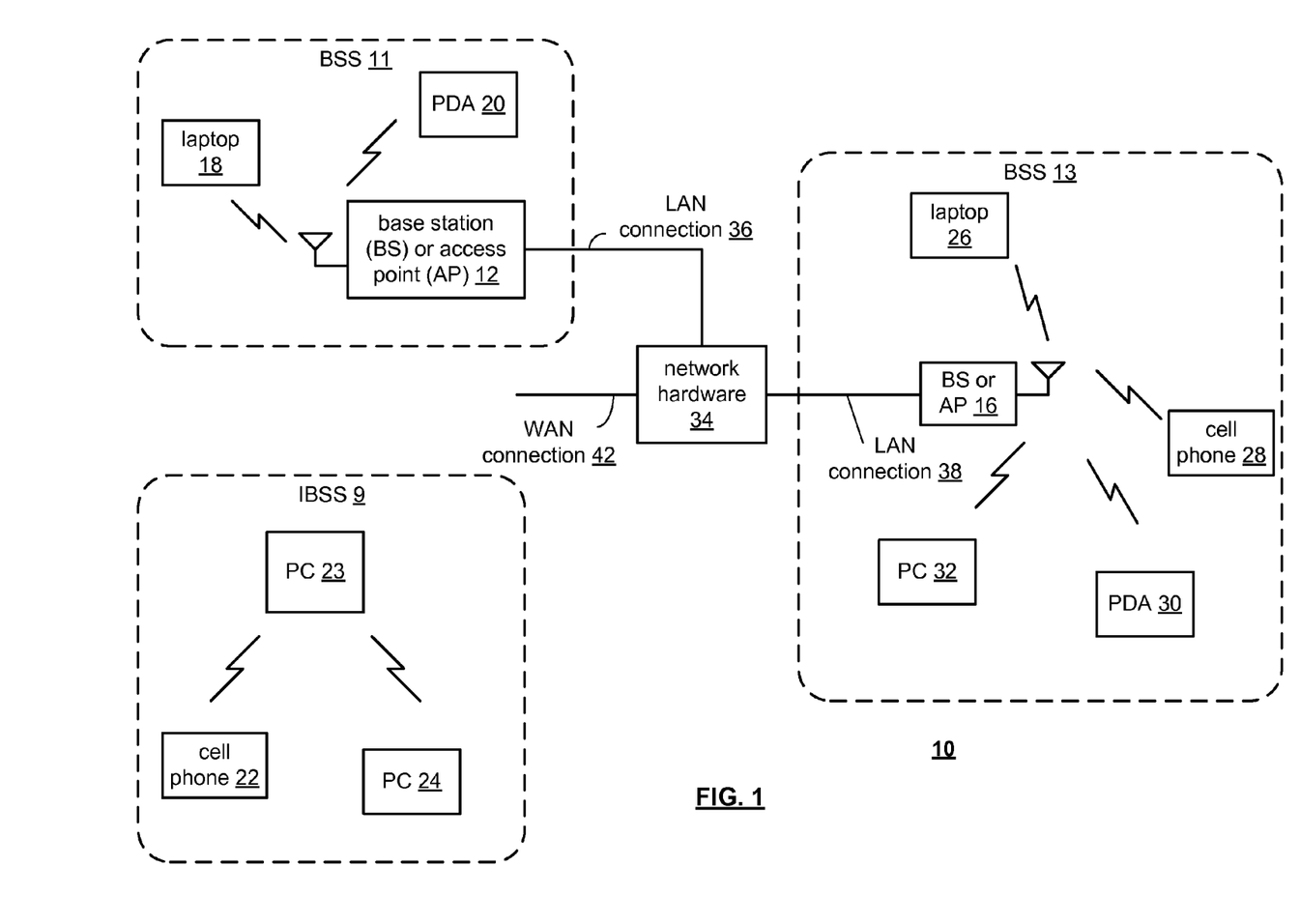
FIG. 1 is a schematic block diagram of an embodiment of a wireless communication system in accordance with the present invention.

FIG. 1 is a schematic block diagram illustrating a communication system 10 that includes a plurality of base stations and/or access points 12, 16, a plurality of wireless communication devices 18-32 and a network hardware component 34. Note that the network hardware 34, which may be a router, switch, bridge, modem, system controller, et cetera provides a wide area network connection 42 for the communication system 10. Further note that the wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to one or more of FIGS. 2-10.

Wireless communication devices 22, 23, and 24 are located within an independent basic service set (IBSS) area and communicate directly (i.e., point to point). In this configuration, these devices 22, 23, and 24 may only communicate with each other. To communicate with other wireless communication devices within the system 10 or to communicate outside of the system 10, the devices 22, 23, and/or 24 need to affiliate with one of the base stations or access points 12 or 16.

The base stations or access points 12, 16 are located within basic service set (BSS) areas 11 and 13, respectively, and are operably coupled to the network hardware 34 via local area network connections 36, 38. Such a connection provides the base station or access point 12 16 with connectivity to other devices within the system 10 and provides connectivity to other networks via the WAN connection 42. To communicate with the wireless communication devices within its BSS 11 or 13, each of the base stations or access points 12-16 has an associated antenna or antenna array. For instance, base station or access point 12 wirelessly communicates with wireless communication devices 18 and 20 while base station or access point 16 wirelessly communicates with wireless communication devices 26-32. Typically, the wireless communication devices register with a particular base station or access point 12, 16 to receive services from the communication system 10.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
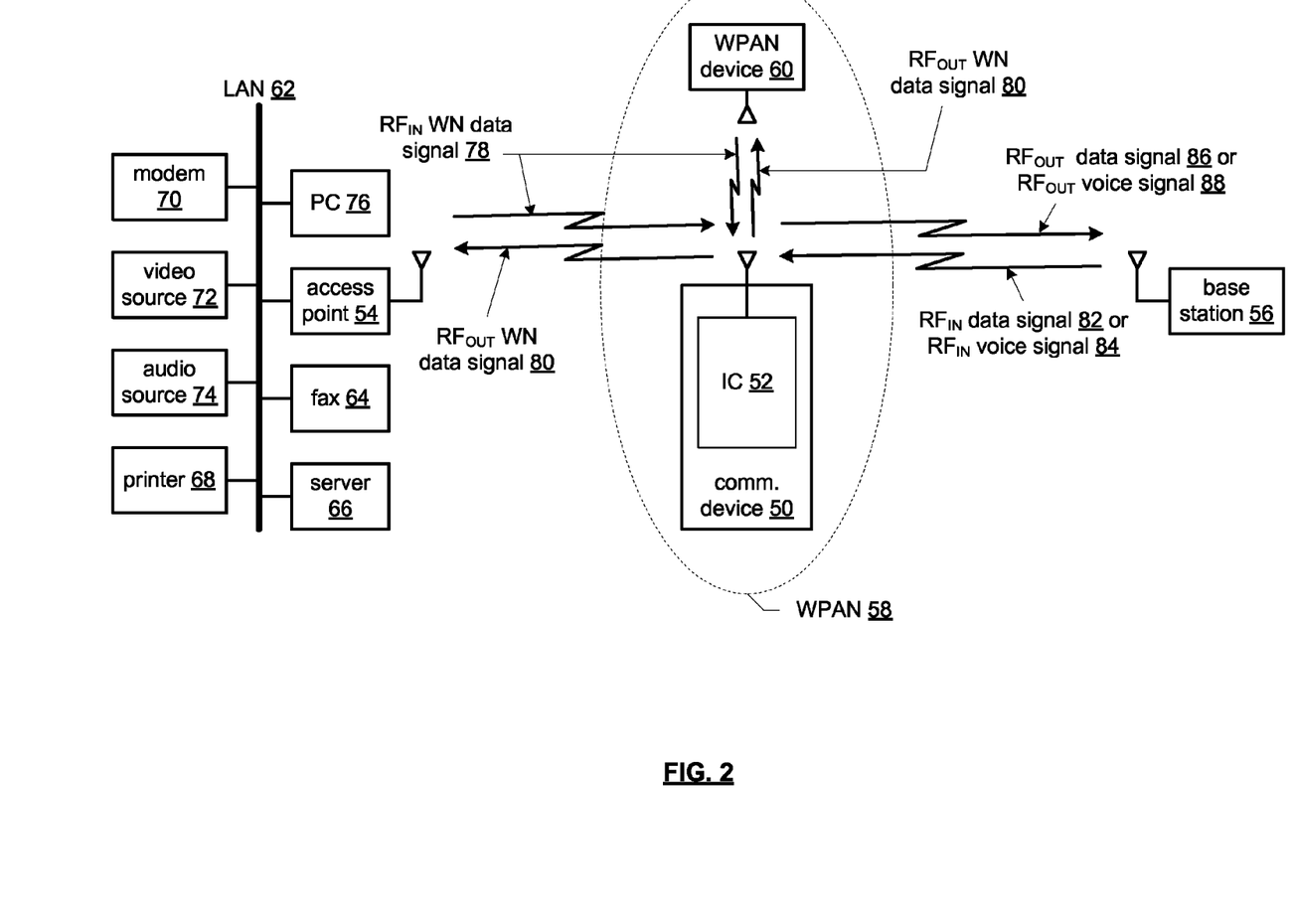
FIG. 2 is a schematic block diagram of an embodiment of a wireless communication device in accordance with the present invention.

FIG. 2 is a schematic block diagram of another embodiment of a wireless communication system that includes a communication device 50 associated with a cellular network, a wireless local area network (WLAN) and/or a wireless personal area network (WPAN) 58. The WLAN network is shown to include an access point 54, a local area network (LAN) bus 62, a modem 70, a video source 72, an audio source 74, a printer 68, a personal computer (PC) 76, a facsimile machine (fax) 64, and a server 66, but may include more or less components than shown. The cellular network is shown to include a base station 56, which may support voice communications and/or data communications. Note that the cellular network may include more components than the base station 56. The WPAN 58 includes at least one WPAN device 60 that is proximal to the communication device 50. Note that the WPAN device 60 may be a Bluetooth headset, a wireless microphone, a wireless speaker, a wireless display, and/or a wireless data entry unit.

In this embodiment, the communication device 50, which may be one of the communication devices 18-32 of FIG. 1 or another type of communication device, includes an integrated circuit (IC) 52 to communication with the cellular network, the WLAN, and/or the WPAN. Such a communication may include voice communications, audio communications, video communications, graphics communications, text communications, and/or data communications (e.g., emails, web browsing, short message services, etc.). For example, the communication device 50 may be receiving an audio file from the audio source 74 (e.g., a computer storing an MP3 file, a radio receiver, a cable set top box, a satellite receiver, a CD player, etc.), the server 66, and/or the PC 76 via the access point 54 as an inbound RF wireless network (WN) data signal 78. The IC 52 processes the inbound RF WN data signal 78 to produce inbound data that may be rendered audible by speaker circuitry of the IC 52 and/or communication device 50. Alternatively and/or in addition to, the IC 52 may convert the inbound data signal from the WLAN to an outbound RF WN data signal 80 that is provided to the WPAN device 60, which may reproduce the inbound data for presentation (e.g., render it audible).

As another example, the communication device 50 may be receiving a video file from the video source 72 (e.g., a computer storing a video file, a cable set top box, a satellite receiver, a DVDD player, etc.), the server 66, and/or the PC 76 via the access point 54 as an inbound RF WN data signal 78. The IC 52 processes the inbound RF WN data signal 78 to produce inbound data that may be presented on a display (e.g., speakers and LCD, DLP, or plasma display panel) of the communication device 50. Alternatively and/or in addition to, the IC 52 may convert the inbound data signal from the WLAN to an outbound RF WN data signal 80 that is provided to the WPAN device 60, which may reproduce the inbound data for presentation (e.g., play the video file).

As yet another example, the communication device 50 may record video, voice, and/or audio to produce a recorded file. In this example, the IC 52 may convert the recorded file into an outbound RF WN data signal 80 that is provided to the WLAN. The access point 54 recovers the recorded file and provides it to one of the other devices (e.g., PC 76, server 66, modem 70) for storage and/or forwarding onto the Internet.

As a further example, the modem 70, the PC 76, the server 66, the fax 64, and/or the printer 68 may provide a file to the access point 54 for communication to the communication device 50. In this instance, the access point 54 converts the file into the inbound WN data signal 78. The IC 52 processes the received the inbound WN data signal 78 to recapture the file, which may be presented on the communication device 50 and/or provided to the WPAN device 60.

As yet a further example, the communication device 50 may have a graphics, text, and/or a data file for communication to a component of the WLAN. In this example, the IC 52 converts the graphics, text, and/or data file into the outbound RF WN data signal 80 that is provided to the access point 54 and/or to the WPAN 60. In one embodiment, the access point 54 recovers the graphics, text, and/or data file and provides it to the PC 76, the modem 70, the fax 64, the printer 68, and/or the server 66. Note that the file may include an address that identifies which component(s) of the WLAN are to receive the file.

More examples include voice and/or data communications between the communication device 50 and the base station 56 in accordance with one or more cellular communication standards, which includes, but is not limited to, past, present, and/or future versions of GSM, CDMA, wideband CDMA (WCDMA), EDGE, GPRS, AMPS, and digital AMPS. For instance, the IC 52 may process outbound voice signals to produce outbound RF voice signals 88 and process inbound RF voice signals 84 to produce inbound voice signals. The IC 52 may facilitate the presentation of the inbound and outbound voice signals on the communication device 50 and/or transceive them with the WPAN device 60 as the inbound and outbound WN data signals 78 and 80. Further the IC 52 may process outbound data signals to produce outbound RF data signals 86 and process inbound RF data signals 82 to produce inbound data signals. The IC 52 may facilitate the presentation of the inbound and outbound data signals on the communication device 50 and/or transceive them with the WPAN device 60 as the inbound and outbound WN data signals 78 and 80.

Figure 3:
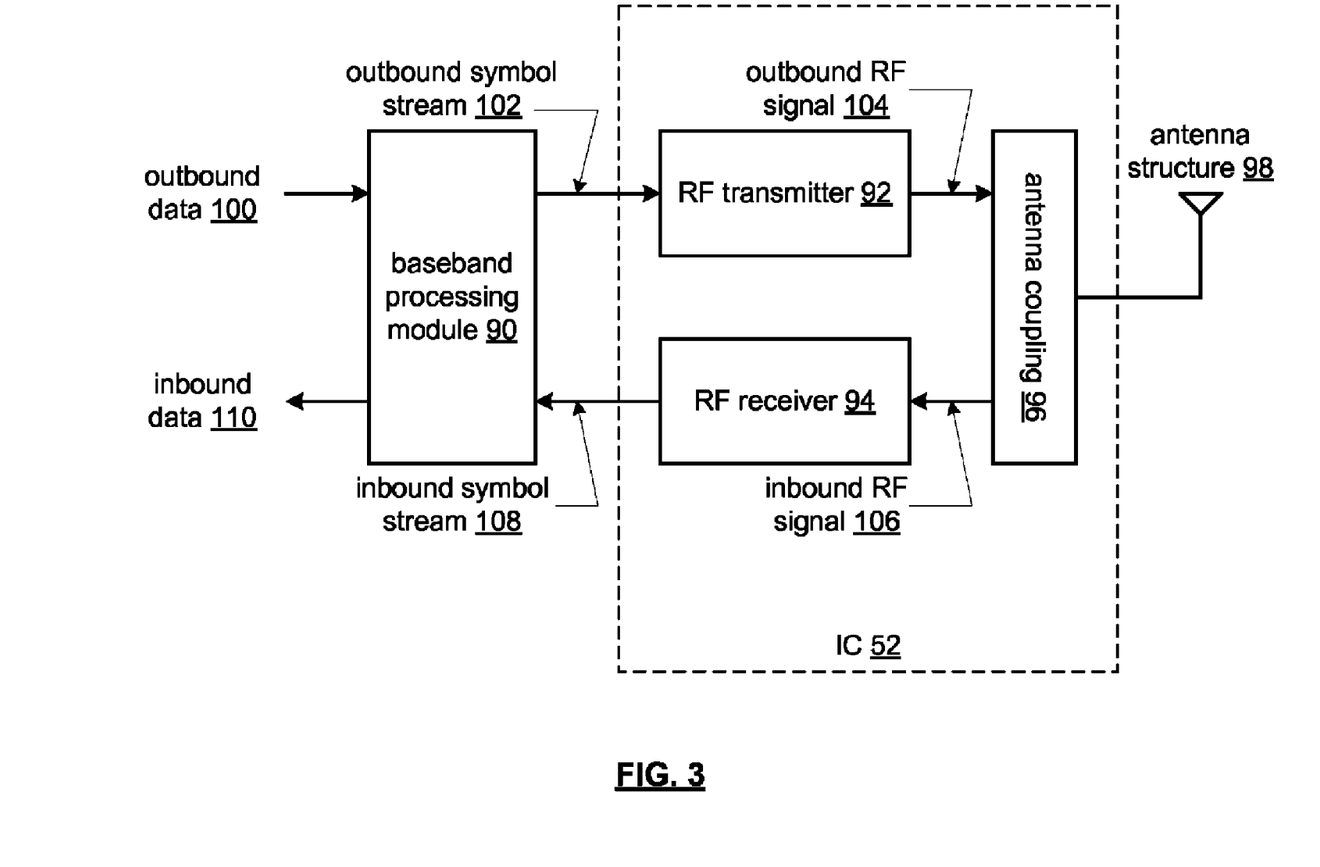
FIG. 3 is a schematic block diagram of another embodiment of a wireless communication device in accordance with the present invention.

FIG. 3 is a schematic block diagram of another embodiment of a wireless communication device that includes a baseband processing module 90 and an antenna structure 98 coupled to the IC 52. The IC 52 includes an RF transmitter section 92, an RF receiver section 94, and an antenna coupling module 96. In another embodiment, the baseband processing module 90 may be included on the IC 52. In yet another embodiment, the antenna coupling module 96 may be off-chip (i.e., not on IC 52).

The baseband processing module 90 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module executes, hard coded and/or operational instructions corresponding to at least some of the steps and/or functions illustrated in FIGS. 3-10.

In operation, the baseband processing module 90 converts outbound data 100 (e.g., voice, text messages, audio files, video files, image files, graphics, etc.) into an outbound symbol stream 102 in accordance with one or more wireless communication protocols (e.g., past, present, and/or future versions of GSM, CDMA, wideband CDMA (WCDMA), EDGE, GPRS, AMPS, digital AMPS, IEEE 802.11, Bluetooth, ZigBee, and/or any other type of wireless network protocol). The outbound symbol stream 102 may include in-phase and quadrature components, phase modulation component, amplitude modulation component, and/or a frequency modulation component.

The RF transmitter section 94, embodiments of which will be described in greater detail with reference to FIGS. 4-6, converts the outbound symbol stream 102 into an outbound RF signal 104. The antenna coupling module 96 (which may include a transformer balun, an impedance matching circuit, and/or a transmission line) provides the outbound RF signal 104 to the antenna structure 98 for transmission. The antenna structure 98 includes one or more antennas to transmit the outbound RF signal 104 and to receive an inbound RF signal 106.

The antenna coupling module 96 provides the inbound RF signal 106 to the RF receiver section 94. The RF receiver section 94, which includes a low noise amplifier module, a down conversion mixing module, filtering, and/or an analog to digital converter, converts the inbound RF signal 106 into an inbound symbol stream 108. The baseband processing module 90 converts the inbound symbol stream 108 into inbound data 110 in accordance with the one or more wireless communication protocols.

Figure 4:
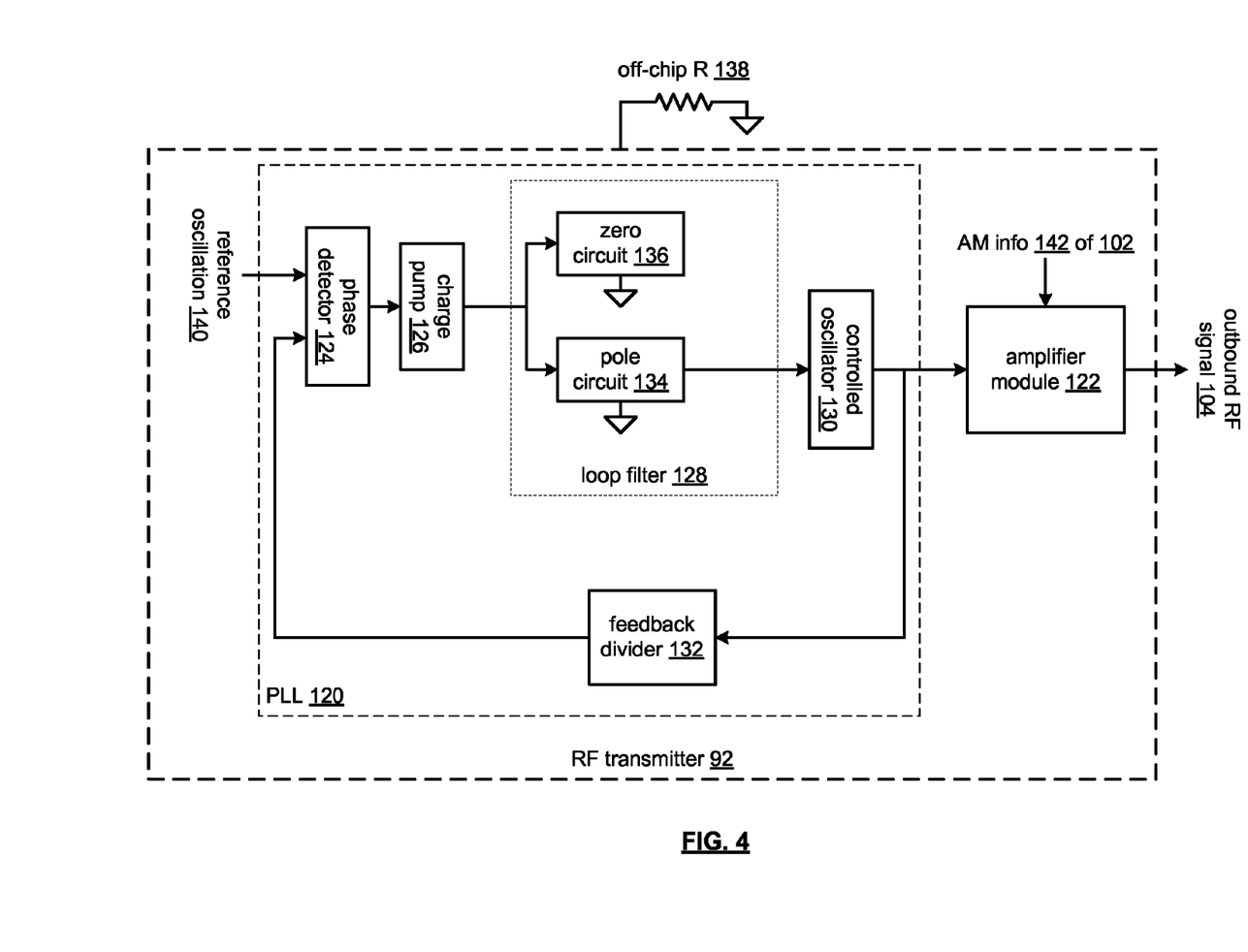
FIG. 4 is a schematic block diagram of an embodiment of an RF transmitter in accordance with the present invention.

FIG. 4 is a schematic block diagram of an embodiment of an RF transmitter 92 that includes a phase locked loop (PLL) 122, an off-chip calibration resistor 138, and an amplifier module 122. The PLL 120 includes a phase detector 124, a charge pump 126, a loop filter 128, a controlled oscillator 130, and a feedback divider 132. The loop filter 128 includes a zero circuit 136 and a pole circuit 134. The amplifier module 122 may include one or more power amplifier drivers and/or one or more power amplifiers coupled in series and/or in parallel. The amplifier module 122 may further include an amplitude modulation module.

In this embodiment, the phase detector 124 produces a difference signal based on a difference between phase of a reference oscillation 140 and phase of a feedback oscillation provided by the feedback divider 132. The charge pump 126 converts the difference signal into an up-signal or a down signal. The loop filter 128 filters the up signal or the down signal to produce a control signal and provides a wide and stable bandwidth (e.g., for GSM/EDGE communications, the PLL bandwidth is set within a range of 200-250 KHz).

To accomplish this, the loop filter includes the pole circuit 134 and the zero circuit 136. The pole circuit 134 includes at least one resistor and at least one capacitor and the zero circuit 136 includes at least one resistor and at least one metal oxide semiconductor (MOS) capacitor to provide a desired frequency response for the PLL. The off-chip calibration resistor may be indirectly coupled to zero circuit and is used to calibrate the zero circuit 136. Various embodiments of the loop filter 128 and the compensation of the zero circuit 136 will be described in greater detail with reference to FIGS. 7 and 8.

Continuing with the discussion of the operation of the PLL 120, the controlled oscillator 130, which may be a current controlled oscillator or a voltage controlled oscillator, generates an output oscillation based on the control signal. The feedback divider generates the feedback oscillation from the output oscillation based on a divider value.

The amplifier module 122 amplifies the output oscillation to produce the outbound RF signal 104. In this embodiment, the amplifier module 122 further includes the amplitude modulation module, which converts at least a portion of the outbound symbol stream 102 into amplitude modulation information 142. The amplifier module 122 modulates the output oscillation in accordance with the amplitude modulation information 142 to produce the outbound RF signal 104. The amplitude modulation information may be in accordance with amplitude modulation (AM), amplitude shift keying (ASK), m-bit quadrature amplitude modulation (m-QAM) 8-bit phase shift keying (8-PSK) and/or any other modulation scheme that varies the amplitude of the transmitted signal.

Figure 5:
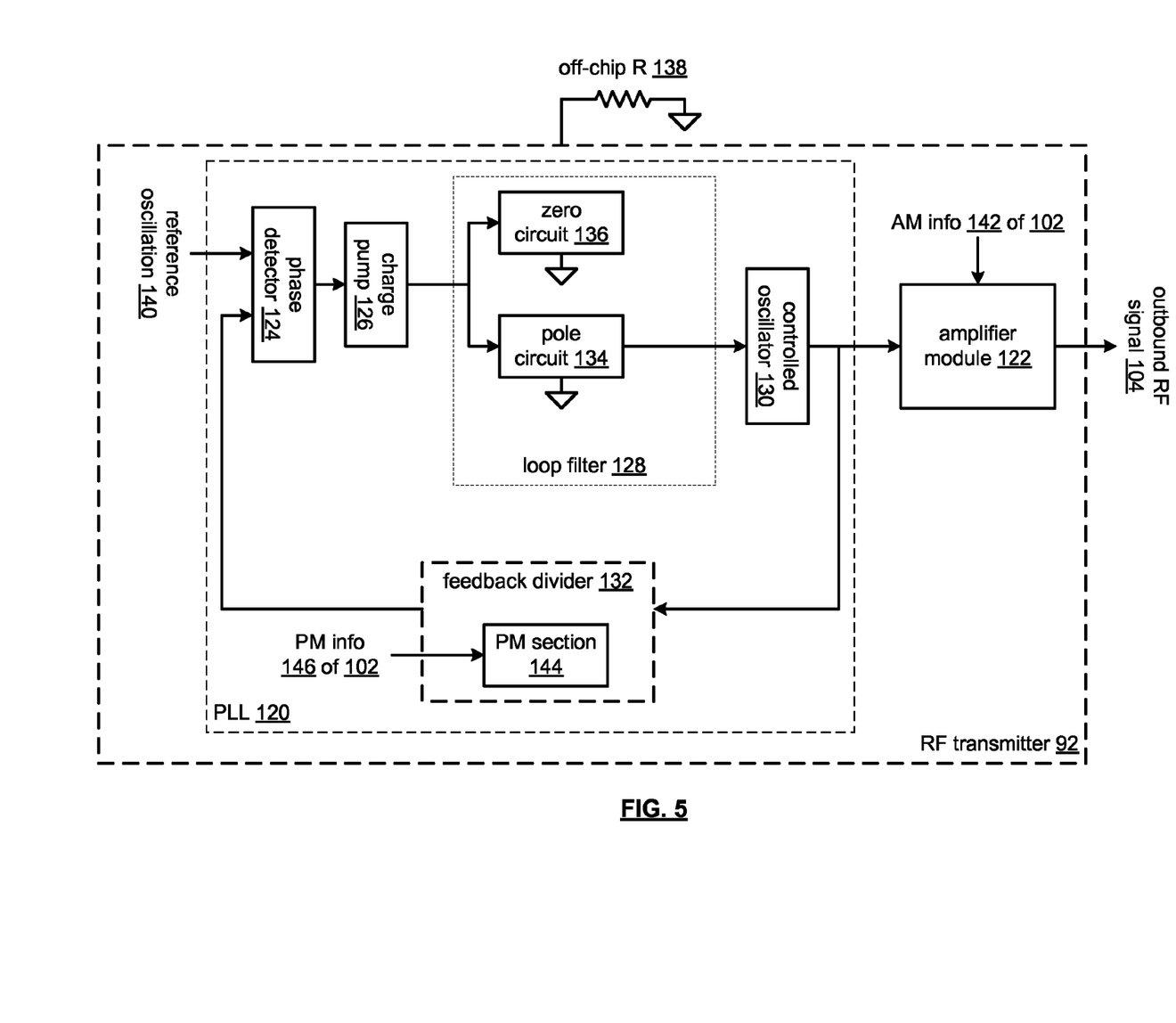
FIG. 5 is a schematic block diagram of another embodiment of an RF transmitter in accordance with the present invention.

FIG. 5 is a schematic block diagram of another embodiment of an RF transmitter that includes the phase locked loop (PLL) 122, the off-chip calibration resistor 138, and the amplifier module 122. The PLL 120 includes the phase detector 124, the charge pump 126, the loop filter 128, the controlled oscillator 130, and the feedback divider 132. The loop filter 128 includes the zero circuit 136 and the pole circuit 134. The feedback divider 132 includes a phase modulation (PM) section 144.

The phase modulation section 144, which may include a sigma delta modulator coupled to a divider block of the feedback divider, receives phase modulation information 146 of the outbound symbol stream 102. The phase modulation section 144, in accordance with the phase modulation information 146, introduces a phase modulation into the feedback oscillation. In this manner, the resulting output oscillation includes the phase modulation. Note that the phase modulation information may be based on binary phase shift keying (BPSK), quadrature PSK, m-bit quadrature amplitude modulation (m-QAM) 8-bit phase shift keying (8-PSK) and/or any other modulation scheme that varies the phase of the transmitted signal.

The amplifier module 122 amplifies the phase modulated output oscillation to produce the outbound RF signal 104. If the outbound symbol stream 102 includes amplitude modulation information 142, the amplifier module 122 modulates the phase modulated output oscillation in accordance with the amplitude modulation information 142 to produce the outbound RF signal 104.

Figure 6:
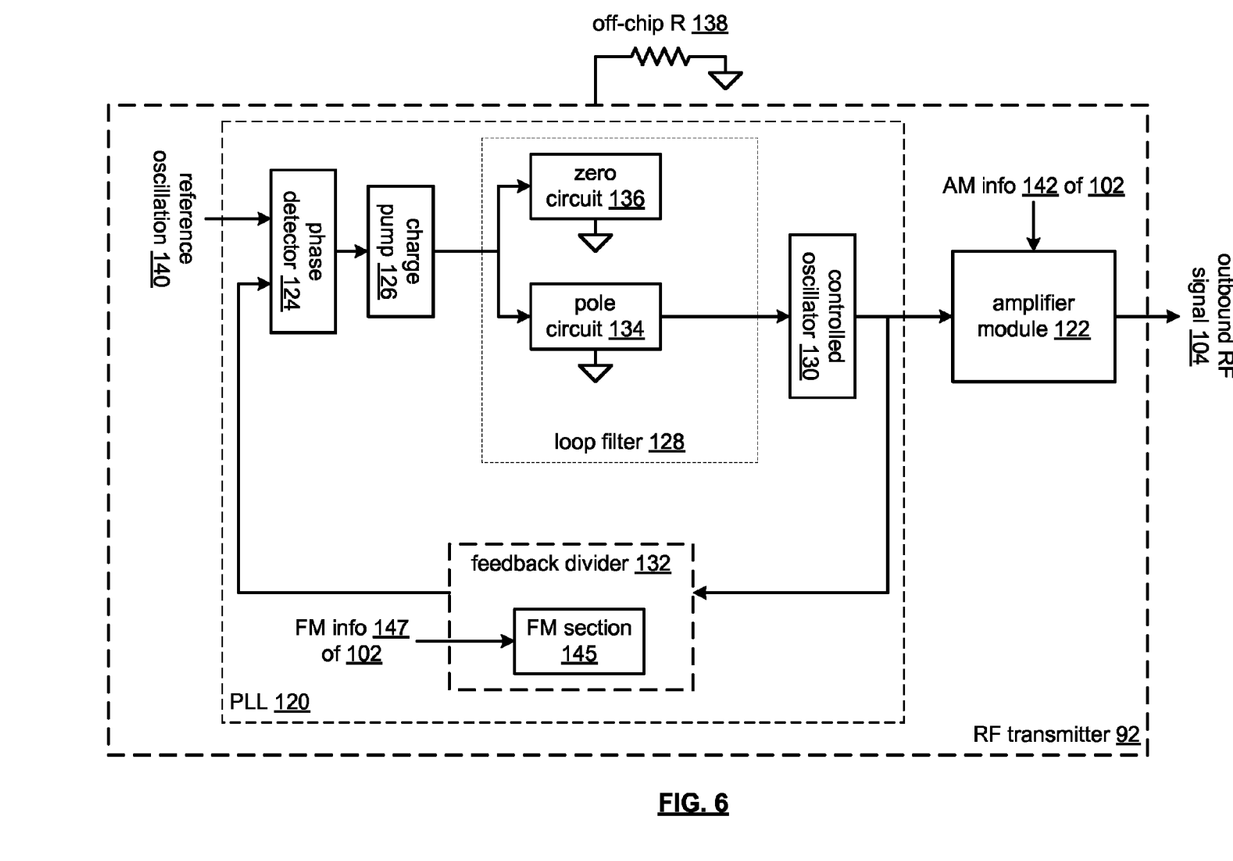
FIG. 6 is a schematic block diagram of another embodiment of an RF transmitter in accordance with the present invention.

FIG. 6 is a schematic block diagram of another embodiment of an RF transmitter that includes the phase locked loop (PLL) 122, the off-chip calibration resistor 138, and the amplifier module 122. The PLL 120 includes the phase detector 124, the charge pump 126, the loop filter 128, the controlled oscillator 130, and the feedback divider 132. The loop filter 128 includes the zero circuit 136 and the pole circuit 134. The feedback divider 132 includes a frequency modulation (FM) section 145.

The frequency modulation section 145, which may include a sigma delta modulator coupled to a divider block of the feedback divider, receives frequency modulation information 147 of the outbound symbol stream 102. The frequency modulation section 145, in accordance with the frequency modulation information 147, introduces a frequency modulation into the feedback oscillation. In this manner, the resulting output oscillation includes the frequency modulation. Note that the frequency modulation information may be based on frequency modulation (FM), frequency shift keying (FSK), minimum shift keying (MSK), Gaussian MSK, Gaussian FSK, and/or any other modulation scheme that varies the frequency of the transmitted signal.

The amplifier module 122 amplifies the frequency modulated output oscillation to produce the outbound RF signal 104. If the outbound symbol stream 102 includes amplitude modulation information 142, the amplifier module 122 modulates the frequency modulated output oscillation in accordance with the amplitude modulation information 142 to produce the outbound RF signal 104.

Figure 7:
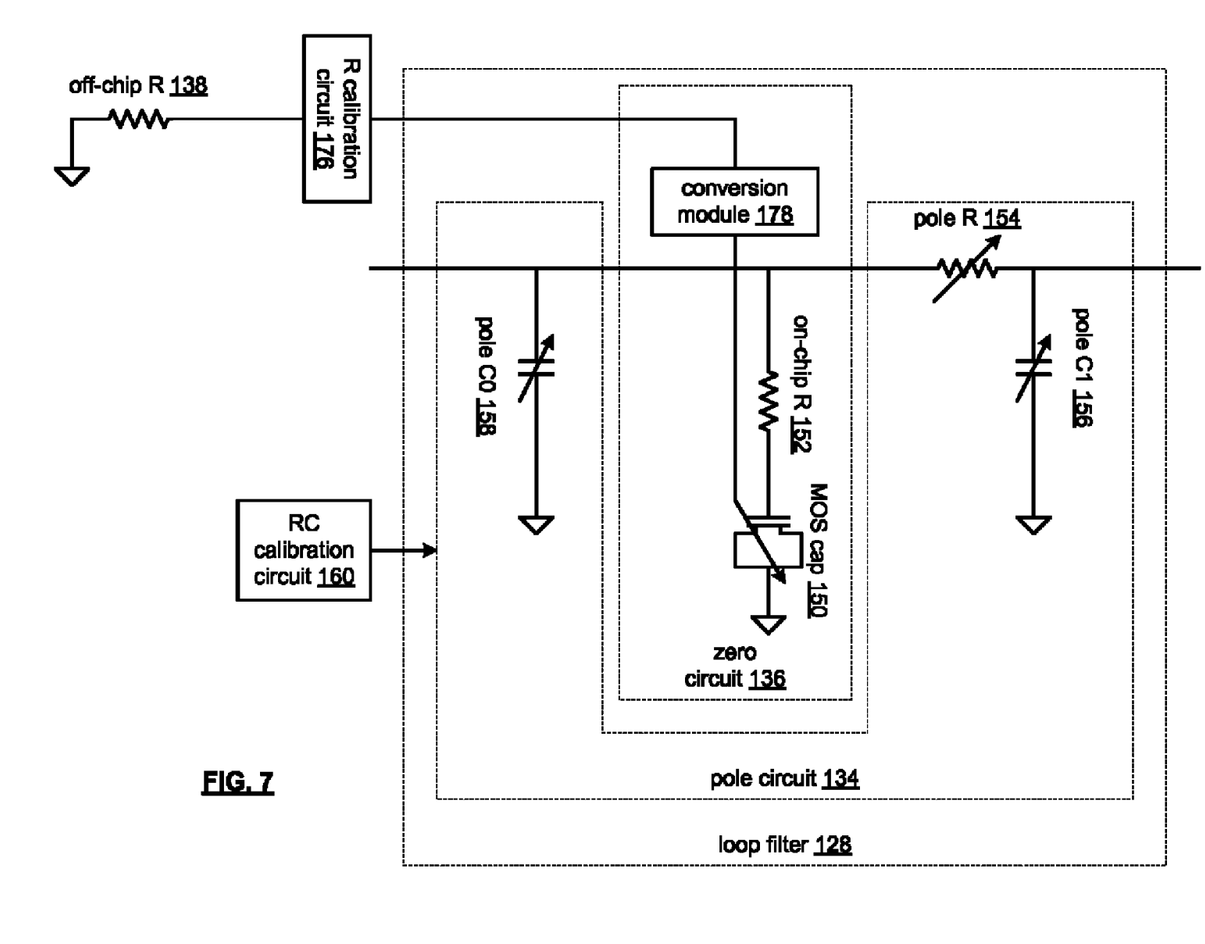
FIG. 7 is a schematic block diagram of an embodiment of a loop filter in accordance with the present invention.

FIG. 7 is a schematic block diagram of an embodiment of a loop filter 128 that includes the pole circuit 134 and the zero circuit 136. The zero circuit 136 includes an on-chip resistor 152, a metal oxide semiconductor (MOS) capacitor 150, and a conversion module 178. The zero circuit 136 yields a zero at a frequency corresponding to the product of the on-chip resistor 152 and the MOS capacitor 150. The off-chip calibration resistor 138 is coupled to a resistor (R) calibration circuit 176, which is coupled to the conversion module 178 to facilitate the compensation of the zero circuit 136. An embodiment of the zero circuit 134 will be described in greater detail with reference to FIG. 8.

The pole circuit 134 includes a first pole capacitor (C0), a resistor (pole R), and a second capacitor (C1). The first pole capacitor, which may be a metal capacitor, provides a first pole at DC. The second capacitor, which may be a metal capacitor, and the second resistor provide a second pole at a frequency corresponding to the product of the two components. To ensure that the second pole is at the desired frequency, the RC calibration circuit 160 calibrates the second resistor and/or the second capacitor. In such an embodiment, the loop filter 128 establishes the bandwidth for the PLL 120, which is much greater than the inverse of a frequency response of the zero circuit.

Figure 8:
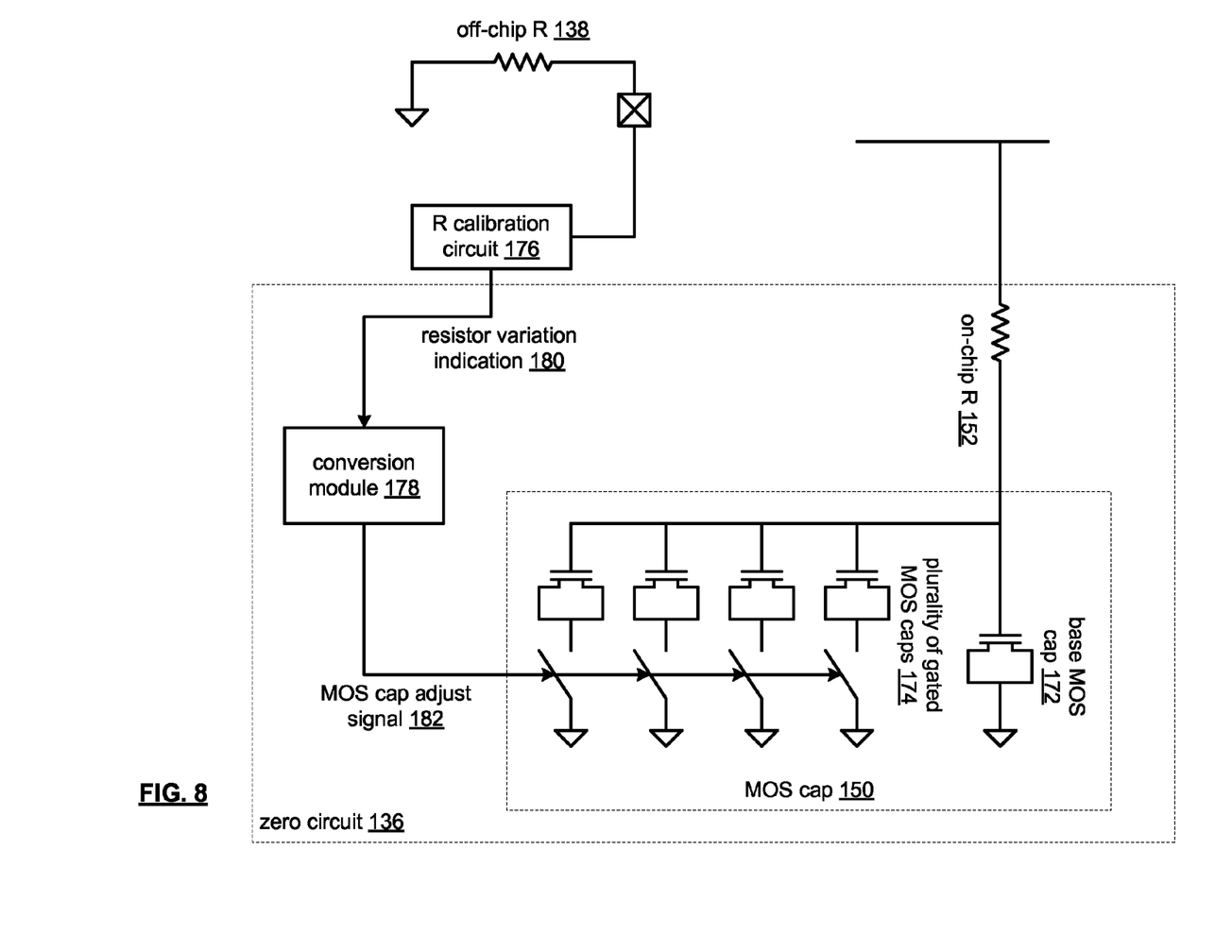
FIG. 8 is a schematic block diagram of an embodiment of a zero circuit in accordance with the present invention.

FIG. 8 is a schematic block diagram of an embodiment of the zero circuit 136 that includes the on-chip resistor 152, the MOS capacitor 150, and the conversion module 178. The R calibration circuit 176 and the off-chip calibration resistor 138 are coupled to the conversion module 178. The MOS capacitor 150 includes a base MOS capacitor 172 and a plurality of gated MOS capacitors 174.

To calibrate the zero circuit 136, and in particular, the MOS capacitor 150, the R calibration circuit 176 is coupled to the off-chip calibration resistor 138 to produce a resistor variation indication 180. For example, the off-chip calibration resistor 138 may be a high precision resistor (e.g., tolerance of 1% or less) that is coupled to receive a reference current and thereby produce a voltage. The same reference current is provided to an on-chip resistor, which may be the on-chip resistor 152 or an on-chip resistor that has similar properties to the on-chip resistor 152, to produce a second voltage. The R calibration circuit compares the two voltages to determine the resistor variation indication 180.

The conversion module 178, which may be a look up table, a voltage to digital signal mapping function, etc., converts the resistor variation indication 180 into a MOS capacitor adjust signal 182. The MOS capacitor adjust signal 182 enables at least one of the plurality of gated MOS capacitors 174 such that the MOS capacitor 150 compensates for the error of the on-chip resistor 152 to establish the zero at the desired frequency.

Figure 9:
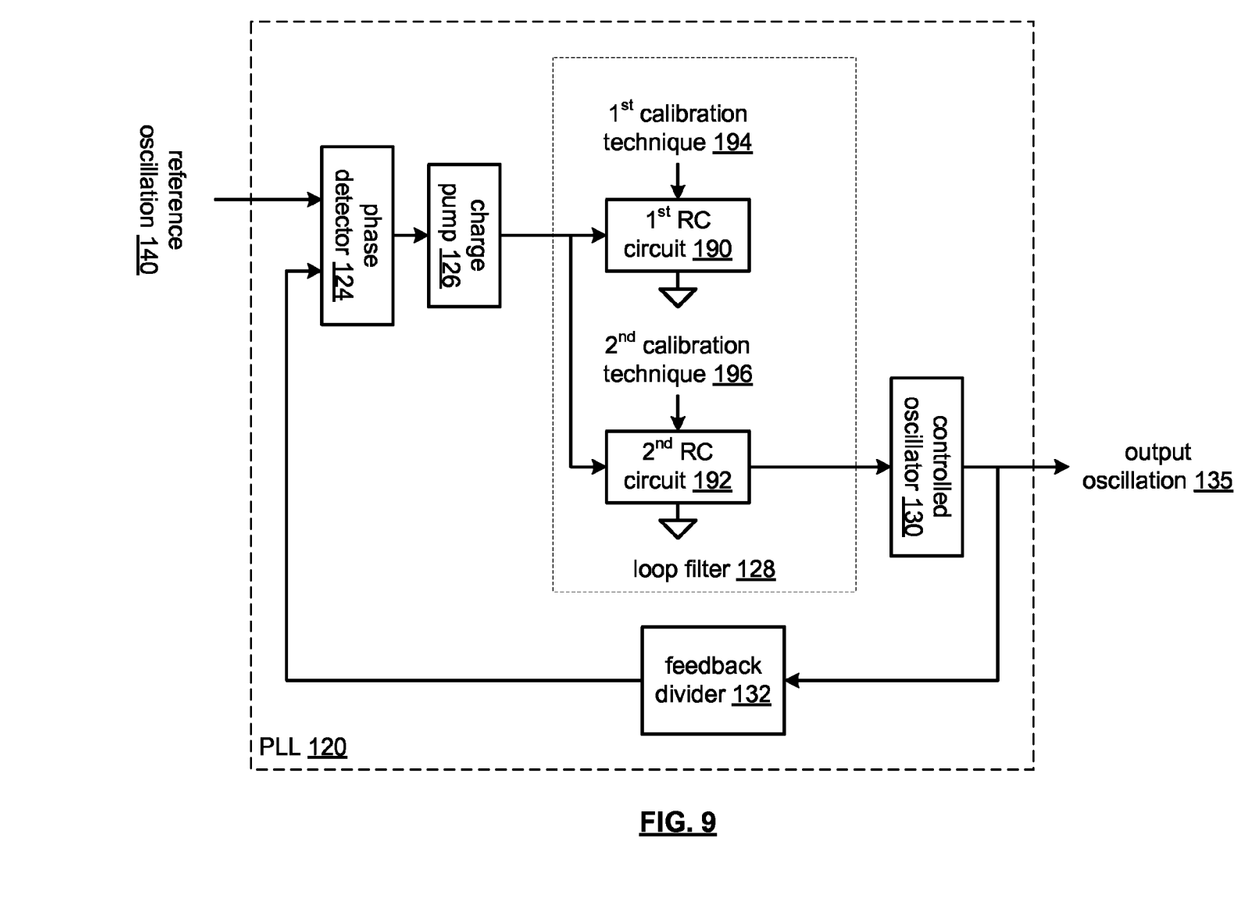
FIG. 9 is a schematic block diagram of an embodiment of a PLL in accordance with the present invention.

FIG. 9 is a schematic block diagram of an embodiment of a PLL 120 that includes the phase detector 124, the charge pump 126, a loop filter 128, the controlled oscillator 130, and the feedback divider 132. The loop filter 128 includes a first resistor-capacitor (RC) circuit 190 and a second RC circuit 192. In this embodiment, the first resistor-capacitor circuit 190 is calibrated using a first calibration technique 194 and the second resistor-capacitor circuit 192 is calibrated using a second calibration technique 196. The loop filter 128 of this embodiment will be described in greater detail with reference to FIG. 10.

Figure 10:
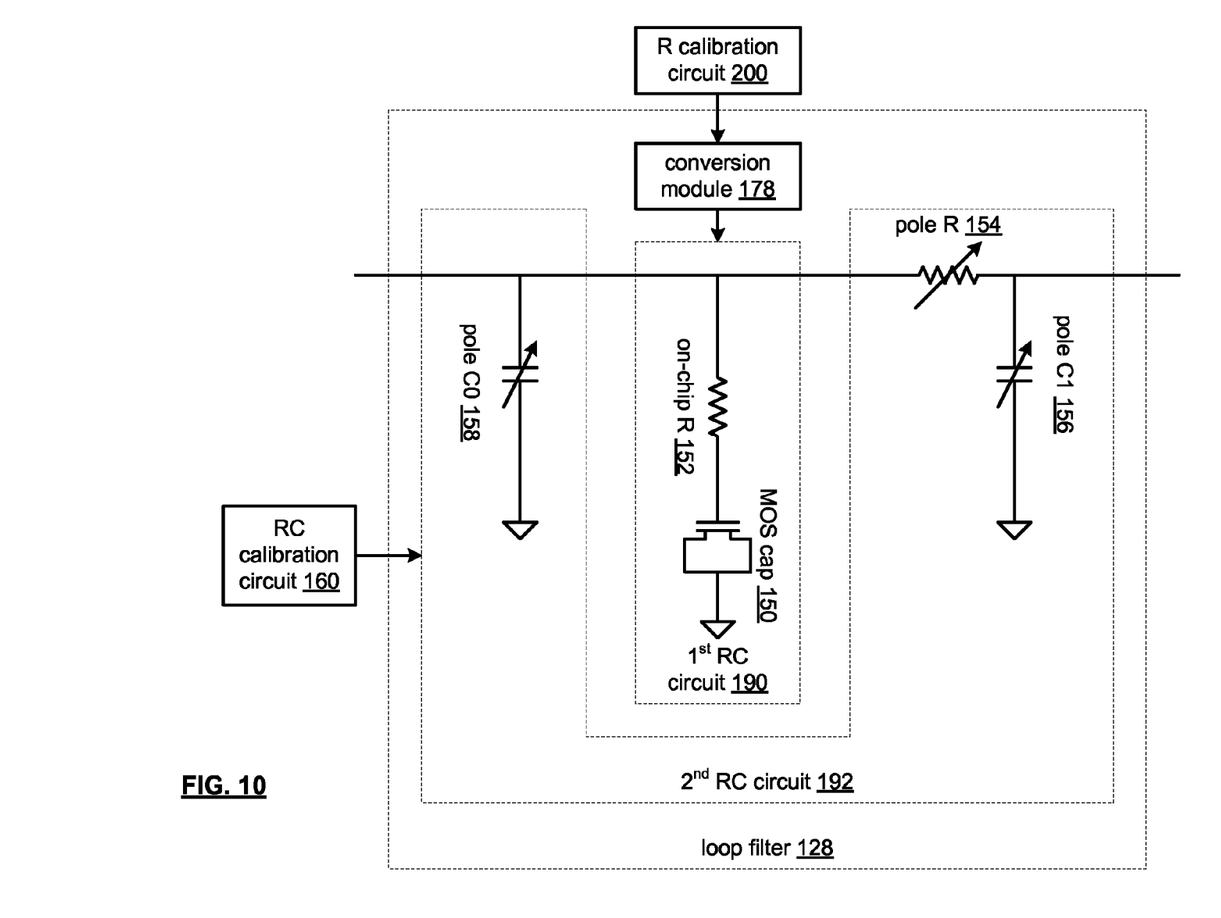
FIG. 10 is a schematic block diagram of another embodiment of a loop filter in accordance with the present invention.

FIG. 10 is a schematic block diagram of another embodiment of a loop filter 128 that includes the first RC circuit 190, the second RC circuit 192, a resistor (R) calibration circuit 200, the conversion module 178, and an RC calibration circuit 160. The first RC circuit 190 includes the on-chip resistor 152 and the MOS capacitor 150 to provide a zero at a desired frequency. The second RC circuit 192 includes the first pole capacitor, which may be a metal capacitor, to provide a first pole at DC. The second RC circuit 192 also includes a second capacitor, which may be a metal capacitor, and the second resistor provide a second pole at a frequency corresponding to the product of the two components. To ensure that the second pole is at the desired frequency, the RC calibration circuit 160 calibrates the second resistor and/or the second capacitor.

In an embodiment, the MOS capacitor 150 may include a base metal oxide semiconductor (MOS) capacitor and a plurality of gated MOS capacitors coupled in parallel with the base MOS capacitor. In this embodiment, the R calibration circuit 200 may include an on-chip calibration resistor and is coupled to an off-chip calibration resistor to produce a resistor variation indication of the on-chip resistor. The conversion module 178 is coupled to convert the resistor variation indication into a MOS capacitor adjust signal, wherein the MOS capacitor adjust signal enables at least one of the plurality of gated MOS capacitors.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A phase locked loop (PLL) comprises:
   a phase detector coupled to produce a difference signal based on a difference between phase of a reference oscillation and phase of a feedback oscillation;
   a charge pump coupled to convert the difference signal into an up-signal or a down signal;
   a loop filter coupled to filter the up signal or the down signal to produce a control signal, wherein the loop filter includes:
      a first resistor-capacitor circuit; and
      a second resistor-capacitor circuit, wherein the first resistor-capacitor circuit is calibrated using a first calibration technique and the second resistor-capacitor circuit is calibrated using a second calibration technique;
   a controlled oscillator coupled to generate an output oscillation based on the control signal; and
   a feedback divider coupled to generate the feedback oscillation from the output oscillation based on a divider value.

2. The PLL of claim 1, wherein the first resistor-capacitor circuit comprises:
   a first resistor; and
   a first capacitor coupled in series with the first resistor to provide a zero of the loop filter.

3. The PLL of claim 2, wherein the first capacitor comprises:
   a base metal oxide semiconductor (MOS) capacitor; and
   a plurality of gated MOS capacitors coupled in parallel with the base MOS capacitor.

4. The PLL of claim 3 comprises:
   a resistor calibration circuit to perform the first calibration technique.

5. The PLL of claim 4, wherein the resistor calibration circuit comprises:
   an off-chip calibration resistor;
   a resistor calibration circuit coupled to the off-chip calibration resistor to produce an on-chip resistor variation indication; and
   a conversion module coupled to convert the resistor variation indication into a MOS capacitor adjust signal, wherein the MOS capacitor adjust signal enables at least one of the plurality of gated MOS capacitors.

6. The PLL of claim 1, wherein the second resistor-capacitor circuit comprises:
   a pole capacitor to provide a first pole;
   a second resistor; and
   a second capacitor coupled to the second resistor to provide a second pole.

7. The PLL of claim 6 comprises:
   a resistor-capacitor calibration circuit to perform the second calibration technique.

8. The PLL of claim 1 comprises:
   a loop bandwidth that is much greater than an inverse of a frequency response of the first resistor-capacitor circuit.

9. The PLL of claim 1, further comprising a resistor calibration circuit to perform the first calibration technique.

10. The PLL of claim 9, wherein the resistor calibration circuit comprises:
    an off-chip calibration resistor;
    a resistor calibration circuit coupled to the off-chip calibration resistor to produce an on-chip resistor variation indication; and
    a conversion module coupled to convert the resistor variation indication into a capacitor adjust signal, wherein the capacitor adjust signal enables at least one of the plurality of gated MOS capacitors.

11. The PLL of claim 1, wherein:
    the first resistor-capacitor circuit comprises a zero circuit; and
    the second resistor-capacitor circuit pole circuit.

12. The PLL of claim 11, wherein the pole circuit comprises:
    a pole capacitor to provide a first pole;
    a second resistor; and
    a second capacitor coupled to the second resistor to provide a second pole.

13. An on-chip phase locked loop (PLL) comprises:
    a phase detector coupled to produce a difference signal based on a difference between phase of a reference oscillation and phase of a feedback oscillation;
    a charge pump coupled to convert the difference signal into an up-signal or a down signal;
    a loop filter coupled to filter the up signal or the down signal to produce a control signal, wherein the loop filter includes:
       a pole circuit that includes at least one resistor and at least one capacitor;
       a zero circuit that includes at least one resistor and at least one metal oxide semiconductor (MOS) capacitor, wherein the pole circuit and zero circuit provide a desired frequency response for the PLL; and
       an off-chip calibration resistor operable to facilitate compensation of the zero circuit;
    a controlled oscillator coupled to generate an output oscillation based on the control signal; and
    a feedback divider coupled to generate the feedback oscillation from the output oscillation based on a divider value.

14. The on-chip PLL of claim 13, wherein the MOS capacitor comprises:
    a base metal oxide semiconductor (MOS) capacitor; and
    a plurality of gated MOS capacitors coupled in parallel with the base MOS capacitor.

15. The on-chip PLL of claim 14 further comprises:
    a resistor calibration circuit coupled to the off-chip calibration resistor to produce an on-chip resistor variation indication; and
    a conversion module coupled to convert the resistor variation indication into a MOS capacitor adjust signal, wherein the MOS capacitor adjust signal enables at least one of the plurality of gated MOS capacitors.

16. The on-chip PLL of claim 13, wherein the pole circuit comprises:
    a pole capacitor to provide a first pole;
    a second resistor; and a second capacitor coupled to the second resistor to provide a second pole.

17. The on-chip PLL of claim 16 comprises:
a resistor-capacitor calibration circuit to calibrate the second resistor and the second capacitor to provide the second pole at a desired pole location.

18. The on-chip PLL of claim 13 comprises:
a loop bandwidth that is much greater than an inverse of a frequency response of the zero circuit.

19. The on-chip PLL of claim 13, further comprising a resistor calibration circuit to perform a first calibration technique.

20. The on-chip PLL of claim 19, wherein the resistor calibration circuit comprises:
an off-chip calibration resistor;
a resistor calibration circuit coupled to the off-chip calibration resistor to produce an on-chip resistor variation indication; and
a conversion module coupled to convert the resistor variation indication into a capacitor adjust signal, wherein the capacitor adjust signal enables at least one of the plurality of gated MOS capacitors.

21. The on-chip PLL of claim 13, wherein:
a first resistor-capacitor circuit comprises a zero circuit; and
a second resistor-capacitor circuit pole circuit.

22. The on-chip PLL of claim 21, wherein the pole circuit comprises:
a pole capacitor to provide a first pole;
a second resistor; and
a second capacitor coupled to the second resistor to provide a second pole.

* * * * *